United States Patent [19]

Palet et al.

[11] Patent Number: 4,588,042

[45] Date of Patent: May 13, 1986

[54] PARABOLIC SPEAKER

[76] Inventors: Timothy J. Palet; George Spector, both of 233 Broadway Rm. 3615, New York, N.Y. 10007

[21] Appl. No.: 633,654

[22] Filed: Jul. 23, 1984

[51] Int. Cl.⁴ .............................................. H05K 5/00

[52] U.S. Cl. .................................. 181/153; 181/144; 181/155; 181/199

[58] Field of Search ............... 181/144, 150, 153, 155, 181/156, 175, 199

[56] References Cited

U.S. PATENT DOCUMENTS

| | | | |
|---|---|---|---|
| 1,732,722 | 10/1929 | Horn | 181/175 X |
| 2,973,824 | 3/1961 | Pinski | 181/144 |
| 3,819,006 | 6/1974 | Westlund | 181/155 X |
| 4,421,200 | 12/1983 | Ferralli et al. | 181/155 X |

*Primary Examiner*—Benjamin R. Fuller

[57] ABSTRACT

A parabolic speaker system is provided and consists of a cabinet that has a front grille and a parabolic rear reflecting surface. Inverted woofer, midrange and tweeter speakers are mounted within said cabinet so that sounds would be reflected back to a listener at a wider and fuller range.

1 Claim, 5 Drawing Figures

PARABOLIC SPEAKER

BACKGROUND OF THE INVENTION

The instant invention relates generally to loudspeaker enclosures and more specifically it relates to a parabolic speaker system.

Numerous loudspeaker enclosures have been provided in prior art that are adapted to produce and project sounds. For example U.S. Pat. Nos. 4,196,790; 4,215,761 and 4,284,844 all are illustrative of such prior art. While these units may be suitable for the particular purpose to which they address, they would not be suitable for the purposes of the present invention as heretofore described.

SUMMARY OF THE INVENTION

A principle object of the present invention is to provide a parabolic speaker system that has a parabolic rear reflector surface and inverted speakers so that sounds would be reflected back to the listener at a wider and fuller range.

Another object is to provide a parabolic speaker system that has a concave parabolic rear reflecting surface and the inverted speakers located at their focal points.

An additional object is to provide a parabolic speaker system that has a convex parabolic rear reflecting surface and the inverted speakers located at their directrix.

A further object is to provide a parabolic speaker system that has an adjustable convex parabolic rear reflecting surface so that the shape of the reflecting surface can be changed to form variations in the sounds reflected back.

A still further object is to provide a parabolic speaker system that is economical in cost to manufacture.

Further objects of the invention will appear as the description proceeds.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWING FIGURES

DETAILED DESCRIPTION OF THE PREFERRED EMBODIMENTS

Figure 1:
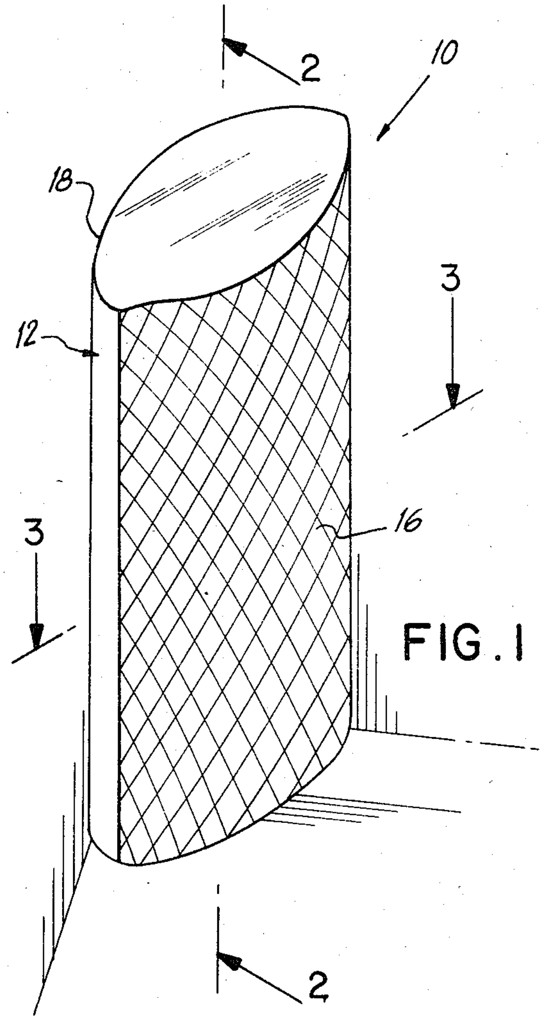
FIG. 1 is a perspective view of the invention.
Figure 2:
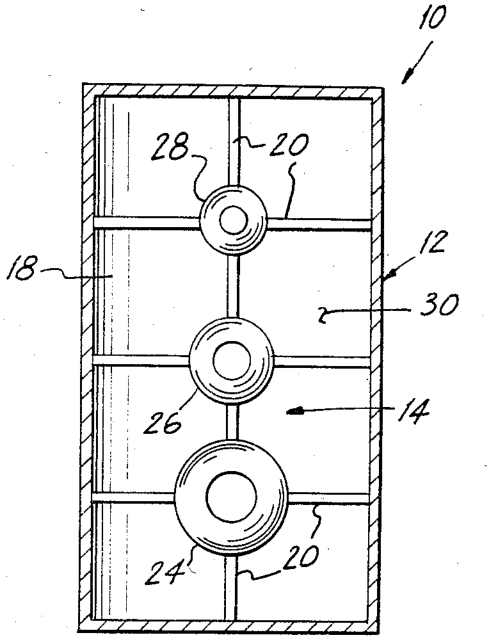
FIG. 2 is a vertical cross sectional view taken along line 2—2 in FIG. 1.
Figure 3:
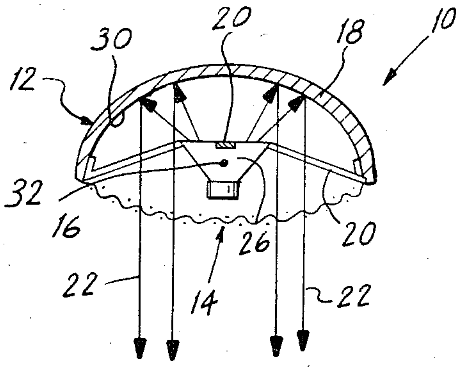
FIG. 3 is a horizontal cross sectional view taken along line 3—3 in FIG. 1.

Turning now descriptively to the drawings, in which similar reference characters denote similar elements throughout the several views, FIGS. 1 through 3 illustrates a parabolic speaker system 10 that consists of an elongated cabinet 12 and a sound source 14.

The cabinet 12 has an acoustically open front end grille 16 and a parabolic rear reflecting surface 18. The sound source 14 is invertably mounted 180° by braces 20 within said cabinet 12 to radiate inwardly so that sounds 22 would be reflected back from the parabolic rear reflecting surface 18 to a listener (not shown) at a wider and fuller range.

The sound source 14 consists of a woofer speaker 24, a midrange speaker 26 and a tweeter speaker 28. The parabolic rear reflecting surface 18 of the cabinet 12 is concave indicated by number 30. The woofer speaker 24, the midrange speaker 26 and the tweeter speaker 28 are each invertably mounted within the cabinet 12 at their focal points 32 with respect to the concave parabolic rear reflecting surface 30 of the cabinet 12.

Figure 4:
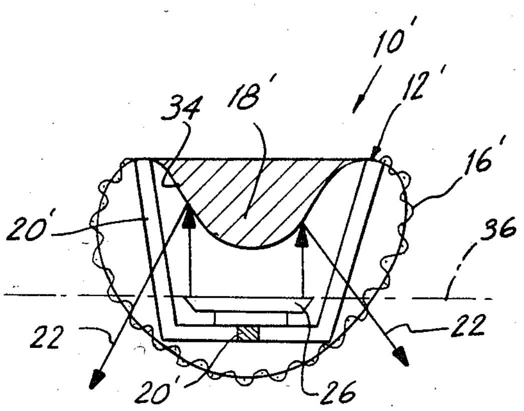
FIG. 4 is a horizontal cross sectional view similar to FIG. 3 of a second embodiment showing a convex parabolic reflecting surface.

FIG. 4 shows a second embodiment of the parabolic speaker system numbered 10'. The parabolic rear reflecting surface 18' of the cabinet 12' is convex indicated by number 34. The woofer speaker 24, the midrange speaker 26 and the tweeter speaker 28 are each invertably mounted 180° by braces 20' within the cabinet 12' at their directrix line 36 with respect to the convex parabolic rear reflecting surface 34 of the cabinet 12'.

Figure 5:
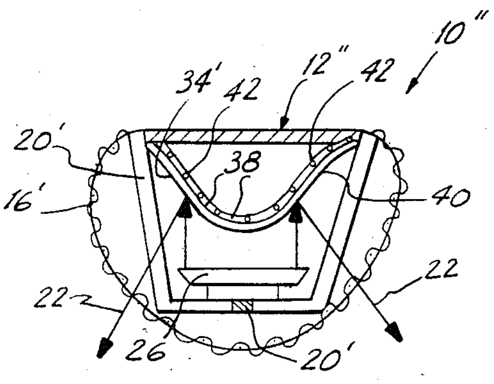
FIG. 5 is a horizontal cross sectional view similar to FIG. 3 of a third embodiment showing the convex parabolic reflecting being adjustable.

FIG. 5 shows a third embodiment of the parabolic speaker system numbered 10''. The convex parabolic rear reflecting surface 34' of the cabinet is adjustable so that shape of the convex parabolic rear reflecting surface 34' can be changed to form variations in the sounds 22 reflected back to the listener.

The adjustable convex parabolic rear reflecting surface 34' consists of a plurality of vertical slat members 38 and a flexible acoustically reflective cover 40. The slat members 38 are pivotally mounted at 42 to each other with each end slat member pivotally mounted to the cabinet 12''. The cover 40 is removably positioned in front of the slat members 38 to form a continuous reflecting surface. The top (not shown) of the cabinet 12'' can be hinged to open. Access into the cabinet can be accomplished to manually move the slat members 38 and cover 40 into different positions. Removal of the cover 40 can also be accomplished when the top of the cabinet 12'' is open when the cover 40 needs to be replaced.

The advantages of the invention are as follows:

1. Fuller sound with limited power requirement.
2. Adaptable to any room, whereas other speakers use a wall to reflect sound.
3. Perfect acoustics.
4. More instrumental, the sounds of each musical instrument are not flooded out by the sound waves of others.
5. Size, the speaker system would fit in a corner of a room and look attractive.

While certain novel features of this invention have been shown and described and are pointed out in the annexed claims, it will be understood that various omissions, substitutions and changes in the forms and details of the device illustrated and in its operation can be made by those skilled in the art without departing from the spirit of the invention.

What is claimed is:

1. A speaker system which comprises:

(a) an elongated cabinet having an acoustically open front end grille and a curved rear reflecting surface of parabolic configuration; and (b) a speaker invertably mounted on and within said surface so that sounds would be reflected back in straight lines from said parabolic rear reflecting surface to a listener at a wider and fuller range, wherein said rear surface of said cabinet is adjustable, wherein its shape can be changed to form variations in said sound patterns reflected back to said listener, wherein said adjustable rear surface comprises:

(a) a plurality of vertical slat members pivotably mounted to each other, with each end slat member pivotably mounted to said cabinet; and (b) a flexible acoustically reflective cover removeably positioned in front of said slat members to form a continuous reflecting surface.

* * * * *